United States Patent [19]

Olson

[11] Patent Number: 4,667,059

[45] Date of Patent: May 19, 1987

[54] CURRENT AND LATTICE MATCHED TANDEM SOLAR CELL

[75] Inventor: Jerry M. Olson, Lakewood, Colo.

[73] Assignee: The United States of America as represented by the United States Department of Energy, Washington, D.C.

[21] Appl. No.: 790,600

[22] Filed: Oct. 22, 1985

[51] Int. Cl.[4] ............................................ H01L 31/18
[52] U.S. Cl. ..................................... 136/249; 29/572; 148/175
[58] Field of Search .................... 136/249 TJ; 29/572; 148/175

[56] References Cited

PUBLICATIONS

S. Bedair et al, *IEEE Trans. Electron Devices*, vol. ED-27, pp. 829–830, (1980).

*Primary Examiner*—Aaron Weisstuch
*Attorney, Agent, or Firm*—Kenneth L. Richardson; Michael J. Higgins; Judson R. Hightower

[57] ABSTRACT

A multijunction (cascade) tandem photovoltaic solar cell device is fabricated of a $Ga_xIn_{1-x}P$ ($0.505 \leq X \leq 0.515$) top cell semiconductor lattice matched to a GaAs bottom cell semiconductor at a low-resistance heterojunction, preferably a p+/n+ heterojunction between the cells. The top and bottom cells are both lattice matched and current matched for high efficiency solar radiation conversion to electrical energy.

13 Claims, 4 Drawing Figures

CURRENT AND LATTICE MATCHED TANDEM SOLAR CELL

CONTRACTUAL ORIGIN OF THE INVENTION

The U.S. Government has rights in this invention under Contract No. DE-AC02-83CH10093 between the U.S. Department of Energy and the Solar Energy Research Institute, a Division of Midwest Research Institute.

BACKGROUND OF THE INVENTION

1. Field of the Invention

This invention relates generally to photovoltaic solar cells and, more specifically, to a high-efficiency multi-junction photovoltaic solar cell device.

2. Description of the Prior Art

Photovoltaic cells, commonly known as solar cells, are essentially semiconductors that have the capability of converting electromagnetic energy, such as light or solar radiation, directly to electricity. Such semiconductors are usually characterized by solid crystalline structures that have energy band gaps between their valence electron bands and their conduction electron bands. Free electrons normally cannot exist or remain in these band gaps. However, when light is absorbed by the type of materials that characterize such photovoltaic cells, electrons that occupy low-energy states are excited to jump the band gap to unoccupied higher energy states. For example, when electrons in the valence band of a semiconductor absorb sufficient energy from photons of the solar radiation, they can jump the band gap to the higher energy conduction band.

Electrons so excited to higher energy states leave behind them unoccupied low-energy positions or holes. Such holes can shift from atom to atom in the crystal lattice; thus, the holes act as charge carriers, as do free electrons in the conduction band, and contribute to the crystal's conductivity. Therefore, most of the photons that are absorbed in the semiconductor give rise to such electron-hole pairs. These electron-hole pairs generate the photocurrent and, in turn, the photovoltage exhibited by solar cells.

The electron-hole pairs produced by the light would eventually recombine, and thereby convert to heat or a photon the energy initially used to jump the band gap, unless prohibited from doing so. Therefore, a local electric field is created in the semiconductor by doping or interfacing dissimilar materials to produce a space charge layer. This space charge layer separates the holes and electrons for use as charge carriers. Once separated, these collected hole and electron charge carriers produce a space charge that results in a voltage across the junction, which is the photovoltage. If these separated hole and charge carriers are allowed to flow through an external load, they constitute a photocurrent.

It is known that photon energies in excess of the threshold energy gap or band gap between the valence and conduction bands are usually dissipated as heat; thus they are wasted and do no useful work. More specifically, there is a fixed quantum of potential energy difference across the band gap in the semiconductor. For an electron in the lower energy valence band to be excited to jump the band gap to the higher energy conduction band, it has to absorb a sufficient quantum of energy, usually from an absorbed photon, with a value at least equal to the potential energy difference across the band gap.

The semiconductor is transparent to radiation with photon energy less than the band gap. On the other hand, if the electron absorbs more than the threshold quantum of energy, e.g., from a larger energy photon, it can jump the band gap. The excess of such absorbed energy over the threshold quantum required for the electron to jump the band gap results in an electron that is higher in energy than most of the other electrons in the conduction band. Electrons that have energy levels higher than the lower edge of the conduction band, i.e., the top edge of the band gap, are referred to as "hot electrons". For every electron excited out of its normal energy level, there is a corresponding "hole". Thus, for each hot electron there can be a corresponding hot hole; both are generally referred to as "hot carriers".

Hot carriers usually lose their excess energy to the host lattice very rapidly as heat. The process in which the hot carriers dissipate their excess energy to the host lattice and equilibrate with the lattice at ambient temperature is known as thermalization. As a result, such thermalization of hot carriers reduces the carriers in energy to the energy level at the edge of the conduction band. Since such thermalization normally occurs in about $10^{-12}$ seconds. In other words, the effective photovoltage of a single band gap semiconductor is limited by the band gap.

The practical effect of the limitation before this invention is that the semiconductor designer has to sacrifice efficiencies in one area to achieve them in another. Specifically, to capture as many photons from the spectrum of solar radiation as possible, the semiconductor has to be designed with a small band gap so that even photons from lower energy radiation can excite electrons to jump the band gap. However, in doing so, there are at least two negative effects that must be traded. First, the small band gap results in a low photovoltage device, thus low power output occurs. Second, the photons from higher energy radiation will produce many hot carriers with much excess energy that will be lost as heat upon almost immediate thermalization of these hot carriers to the edge of the conduction band. On the other hand, if the semiconductor is designed with a larger band gap to increase the photovoltage and reduce energy loss caused by thermalization of hot carriers, then the photons from lower energy radiation will not be absorbed. Consequently, in designing conventional single junction solar cells, it is necessary to balance these considerations and try to design a semiconductor with an optimum band gap, realizing that in the balance, there has to be a significant loss of energy from both large and small energy photons. Materials, such as silicon with a band gap of 1.1 eV and GaAs with a band gap of about 1.4 eV, are relatively inexpensive and are considered to be optimum solar energy conversion semiconductors for conventional single junction solar cells. However, a need still exists for a device that can capture and use a larger range of photon energies from the solar radiation spectrum, yet not sacrifice either photovoltage or excess energy loss to heat by thermalization of hot carriers.

Much work has been done in recent years to solve this problem by fabricating tandem or multijunction (cascade) solar cell structures in which a top cell has a larger band gap and absorbs the higher energy photons, while the lower energy photons pass through the top cell into a lower or bottom cell that has a smaller band gap to absorb lower energy radiation. The two cells are connected electrically in series. Some work has also been done on multijunction photovoltaic cells that have more than two cells connected in series; however, this invention is directed to two cell multijunction devices.

A number of characteristics are necessary to achieve efficient multijunction photovoltaic devices, an optimum combination of which have not been achieved before this invention. Such desirable characteristics include a monolithic multijunction device in which the upper and lower cells are current matched, i.e., absorb photons at the same rate, thus producing the same current. Further, the top cell and the junction between the top and bottom cells should be optically transparent to the lower energy radiation, while the electric current flow between the top and bottom cells should be substantially unimpeded. It is also very desirable, if not essential for economic considerations, that the cell materials be readily available, inexpensive, and relatively easy to fabricate.

It has been widely published and generally accepted by persons skilled in this art based on computer models and calculations that the most efficient, current matched multijunction tandem photovoltaic devices are achieved when the top cell has a band gap in the range of 1.50 to 1.75 eV and the bottom cell has a band gap in the range of 1.00 to 1.25 eV. See, for example, J. A. Hutchby, Robert J. Markunas, and Salah M. Bedair, "Material Aspects of the Fabrication of Multijunction Solar Cells", Center for Semiconductor Research, Research Triangle Park, NC, S.P.I.E. Journal (July 1985), and Fan, et al., "Optimal Design of High-Efficiency Tandem Cells", Proceedings of the 16th IEEE Photovoltaic Specialists Conference, pp. 692-701 (1982). The graph in FIG. 3 was published in both of the above-cited articles to illustrate this "target" band gap range for multijunction tandem photovoltaic devices.

It has also been generally accepted by persons skilled in the art that the desired optical transparency and current conductivity between the top and bottom cells in monolithic multijunction tandem devices would be best achieved by lattice matching the top cell material to the bottom cell material. Mismatches in the lattice constants create defects or dislocations in the crystal lattice where recombination centers can occur to cause the loss of photogenerated minority carriers, thus significantly degrading the photovoltaic quality of the device. More specifically, such effects will decrease the open-circuit voltage ($V_{OC}$), short circuit current ($J_{SC}$), and fill factor (FF), which represents the relationship or balance between current and voltage for effective power output.

In general, efforts and developments in the prior art have been directed toward multijunction tandem cells comprising semiconductor materials in the above-described "target" band gap ranges of 1.50 to 1.75 eV for the top cell and 1.00 to 1.25 eV for the bottom cell in the belief that such ranges offered the most promise for high efficiency devices. For example, the above-cited Hutchby, et. al., article on p. 4 suggests AlGaAs, GaAsP, and AlAsSb for top cells and Si, InGaAs, GaAsSb, InAsP, AlGaSb, and AlInSb for bottom cells. For quaternary alloys, the Hutchby, et. al., article suggests AlGaInP, AlGaInAs, and AlGaAsSb for top cells and InGaAsP, AlGaAsSb, and AlGaInSb for bottom cells. Although, these alloys have band gaps in the target ranges, they are not very well lattice matched, either among these materials themselves or with any inexpensive, readily available substrate material.

Likewise, the above-cited Fan, et al., article extensively discusses the potential use of compositions with band gaps in these "target" band gap ranges. The Fan et. al., article like the Hutchby et. al, article discussed above, directed primary efforts toward minimizing effects of lattice mismatches that cannot be avoided in those materials having band gaps in the "target" ranges.

U.S. Pat. No. 4,255,211 and U.S. Pat. No. 4,332,974, both issued to L. Fraas, disclose the use of a germanium substrate with a $G_{0.88}In_{0.12}As$ (1.25 eV) bottom cell and $Ga_{0.43}In_{0.57}P$ (1.75 eV) top cell deposited thereon. Again, these prior art tandem devices designed by Fraas are directed to the previously-described "target" range band gaps of 1.00 to 1.25 eV for the bottom cell and 1.50 to 1.75 eV for the top cell, while lattice matching is apparently considered secondary. For example, both of the above-cited U.S. Pat. Nos. 4,255,211 and 4,332,974 specify that these materials are only lattice matched to a range of $\pm 1\%$, even in the three-layered, quaternary alloy $Ga_{0.88}In_{0.12}As/Ga_{0.69}In_{0.31}As_{0.5}P_{0.5}/In_{0.5}Ga_{0.5}P$ structure described in U.S. Pat. No. 4,332,974. However, it has now been determined that even lattice mismatching as low as $\pm 0.01\%$ causes significant degradation of photovoltaic quality, which provides some indication why such prior art devices directed to the above-described target band gap ranges do not perform as efficiently as initially expected by persons skilled in the art in spite of their above-described efforts to minimize those effects.

The previously-cited Hutchby, et al, article also discusses the near-perfect lattice-matched cell/substrate structures of AlGaAs/GaAs and GaAs/Ge, which avoid the problems of non-lattice-matched structures. However, GaAs and Ge are not current-matched, so they also do not provide the efficiencies desired. By nature of the series connection, the output current of the device is limited to the smaller of the current producing capabilities of the two cells. The GaAs/AlGaAs structures, on the other hand, are both lattice-matched and current matched; however, efficiency results are inconsistent because of problems with AlGaAs near the direct-to-indirect composition at the heterojunction interface.

Because of the lattice mismatching and/or current mismatching of the prior art multijunction photovoltaic devices, as described above, efficiencies have not approached the theoretical maximum or target of 30 to 36% at AM1. Therefore, a need remains for a current-matched and lattice-matched multijunction solar cell device that does not have the problems described earlier.

SUMMARY OF THE INVENTION

Accordingly, it is a general object of this invention to provide a more efficient multijunction tandem photovoltaic solar cell than has heretofore been available.

It is a specific object of this invention to provide a high efficiency multijunction tandem photovoltaic solar cell with top and bottom cell structures that are both lattice-matched and current matched.

It is also a specific object of this invention to provide a high efficiency multijunction tandem solar cell in which the top and bottom cells are both lattice matched and current matched to consistently produce an open-cell voltage of at least 2.1 to 2.3 V and a fill factor of at least 0.7 to 0.8 or greater.

It is a further specific object of this invention to provide a high-efficiency multijunction tandem solar cell that consistently produces a solar-to-electric energy conversion of 13% AM1 to 30% AM1.

A still further specific object of the present invention is to provide a high-efficiency multijunction tandem solar cell that is relatively easy to fabricate with consistent high quality results by using materials and processes generally well known and within the capabilities of persons having ordinary skill in this art.

A still further specific object of this invention is to provide a GaInP$_2$/GaAs (top cell/bottom cell) cascade solar cell structure that is both lattice matched and current matched.

Additional objects, advantages, and novel features of this invention are set forth in part in the description that follows, and in part will become apparent to those skilled in the art upon examination of the following specification, or may be learned by practicing the invention. The objects and advantages of the invention may be realized and attained by means of the instrumentalities and in combinations particularly pointed out in the appended claims.

To achieve the foregoing and other objects and in accordance with the purposes of the present invention, as embodied and broadly described herein, the method and apparatus of this invention may comprise a high-efficiency multijunction photovoltaic solar cell comprising a top GaInP$_2$ semiconductor cell with an n/p or a p/n homojunction therein for absorbing higher energy photons and a bottom GaAs semiconductor cell with a n/p or a p/n homojunction therein, wherein the GaInP$_2$ and GaAs are lattice-matched and current-matched and are joined together at a low resistance, lattice-matched heterojunction, such as a p+/n+ tunnel junction, and the fabrication and use of such a structure for conversion of solar radiation to electrical energy. According to this invention the solar cell can be connected to a load through electrical contacts attached to opposite sides of the solar cell.

BRIEF DESCRIPTION OF THE DRAWINGS

The accompanying drawings, which are incorporated in and form a part of the specification, illustrate the preferred embodiments of the present invention and, with the description, explain the principles of the invention. In the drawings.

DETAILED DESCRIPTION OF THE PREFERRED EMBODIMENT

Figure 1:
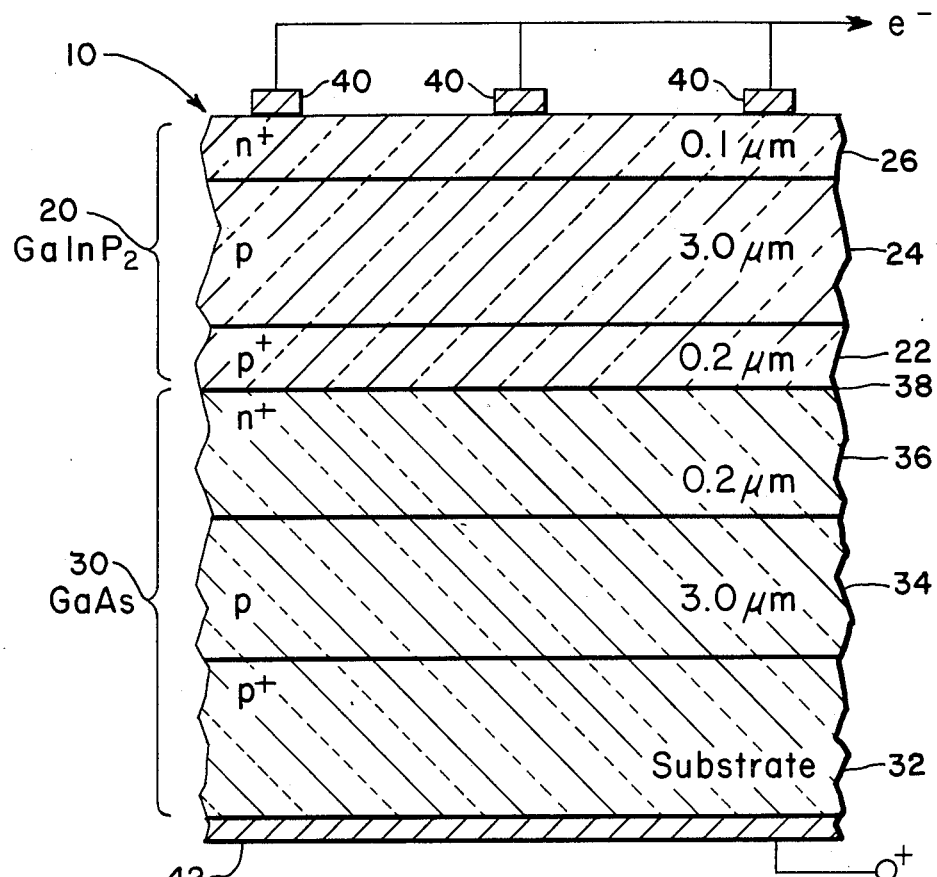
FIG. 1 is a side elevation view in schematic of the multijunction tandem solar cell of the present invention.

FIG. 1 illustrates the multijunction (cascade) tandem solar cell 10 of the present invention in schematic with greatly exaggerated dimensions and proportions for clarity, as will be readily understood by persons skilled in the art. This solar cell 10 is a monolithic tandem device in which the top cell 20 is epitaxially deposited on the bottom cell 30. The bottom cell 30 includes the substrate 32.

According to this invention, the top cell 20 comprises an n+pp+ GaInP$_2$ semiconductor, and the bottom cell 30 comprises an n+pp+ GaAs semiconductor. For purposes of this description, a p+ or n+ denotes carrier concentration of about 5 to $10 \times 10^{-}$cm$^{-3}$, and a p or n denotes carrier concentration of about $10^{16}$ to $10^{17}$ cm$^{-3}$. Moreover, the term "GaInP$_2$" is intended to generically or broadly describe the various species of Ga$_x$In$_{1-x}$P and in particular the stoichiometric formulation wherein x=½, as described in more detail below. Specifically, a GaAs substrate 32 is used as the structural base of the device 10. For concentrator applications, GaAs is relatively inexpensive and readily available so that it can be used economically as a thick substrate 32 while also functioning as the bottom cell.

The GaAs substrate 32 is preferably p+ doped, as shown in FIG. 1. For purposes of this invention, the GaInP$_2$/GaAs cascade solar cell 10 can be grown in a MOCVD reactor (not shown). The bottom cell absorber layer 34 of p-doped GaAs is grown about 3.0 microns thick at about 750° C. on the p+-doped substrate 32. Then, the bottom cell emitter layer 36 of n+-doped GaAs is grown, beginning at about 750° C. to about 0.2 microns.

At that point, the system is rapidly switched to the growth of p+-doped GaInP$_2$ to form the tunnel heterojunction 38 between the top cell 20 and the bottom cell 30. This p+-doped GaInP$_2$ junction layer 22 is preferably grown to about 0.2 microns. Then the subsequent p-doped GaInP$_2$ absorber layer 24 of the top cell 20 is grown at about 625° C. to about 3.0 microns. Finally, the top cell 20 is finished with an n+-doped GaInP$_2$ emitter layer 26 to about 0.1 micron at about 625° C. Of course, a grid electrical contact is fabricated on the emitter layer 26, and an ohmic plate contact 42 is provided on the substrate 32 in a conventional manner. Yet another preferred multijunction solar cell embodiment includes a p-GaAs absorber layer of about 2.9-3.1 microns thick, an n+-GaAs emitter layer of about 0.1-0.3 micron thick, a p+-Ga$_x$In$_{1-x}$P absorber layer of about 2.9-3.1 microns thick, and an n+-Ga$_x$In$_{1-x}$P emitter layer of about 0.05-0.15 micron thick.

A method of growing a lattice-matched InGaP/GaAs heterostructure is described in J. Yoshino, T. Iwamoto, and H. Kukimoto, "Metal-Organic Vapor Phase Epitaxial Growth of the In$_{1-x}$Ga$_x$P", 55 *Journal of Crystal Growth*, at 74-78 (1981). It is also appropriate to mention that while this specification describes an n+pp+-doped top cell and an n+pp+-doped bottom cell, persons skilled in the art will recognize that an inversion of the doping would also work well. Therefore, a p+nn+-doped top cell and a p+nn+-doped bottom cell is considered a functional equivalent of the specific structure described and illustrated herein with only a reverse current direction.

Figure 2:
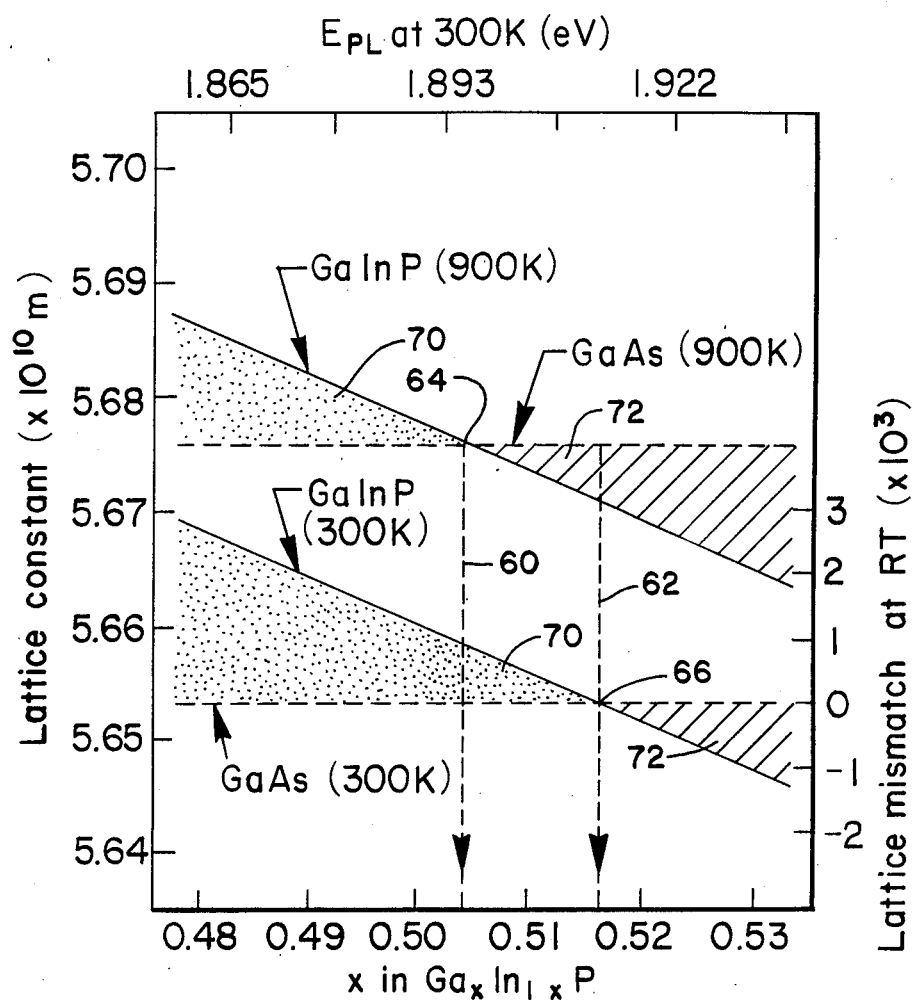
FIG. 2 is a graph showing the relative lattice constants and lattice mismatch characteristics of the GaAs and GaInP cells of the present invention in deposition and ambient temperature ranges.

As shown in FIG. 2, based on a study of temperature coefficients of expansion published by S. Minagawa, et. al., in 71 *Journal of Crystal Growth*, at 377 (1985), the lattic matching constant between GaInP$_2$ and GaAs varies in relation to temperature. However, the optimum lattic match for the temperature range between 900° K. (627° C.) deposition temperature and 300° K. (27° C.) ambient temperature is obtained for Ga$_x$In$_{1-x}$P where $0.505 \leq X \leq 0.515$, as indicated by broken lines 60, 62. In other words, the best lattice match at deposition temperature is shown at point 64 where X≈0.505, and the best lattice match for ambient temperature is shown at point 66 where $X \approx 0.515$. Therefore, the optimum lattice match, which is non-stoichiometric, is where $X \approx 0.51$, thus resulting in a $Ga_{0.51}In_{0.49}P/GaAs$ top cell/bottom cell structure.

It is preferred, if possible, although it is not essential, to formulate the $Ga_xIn_{1-x}P$ alloy with X closer to the 0.505 side of the previously-described range. This preference is best explained by referring again to FIG. 2. The dotted areas 70 indicate ranges where the lattice mismatches put the structure in compression, and the cross-hatched areas 72 indicate ranges where the structure is in tension. Fractures and defects are more likely to occur at the heterojunction when the structure is in tension than when it is in slight compression. Thus, it is preferable to avoid as much of the tension area 72 between lines 60, 62 in the higher deposition temperature range as possible, even though a slight compression occurs in the area 70 between lines 60, 62 at the lower ambient temperature range.

This $Ga_xIn_{1-x}P/GaAs$ top cell/bottom cell cascade solar cell, where $X = 0.51 \pm 0.005$, is not only lattice matched, as described earlier, it is also current matched. In other words, the electric current produced by the top $Ga_{0.51}In_{0.49}P$ cell 20 is about the same as the electric current produced by the bottom GaAs cell 30. Therefore, since current in a series circuit is limited to the smallest current produced by either cell, neither one of these cells inhibits the current flow through the other.

Figure 3:
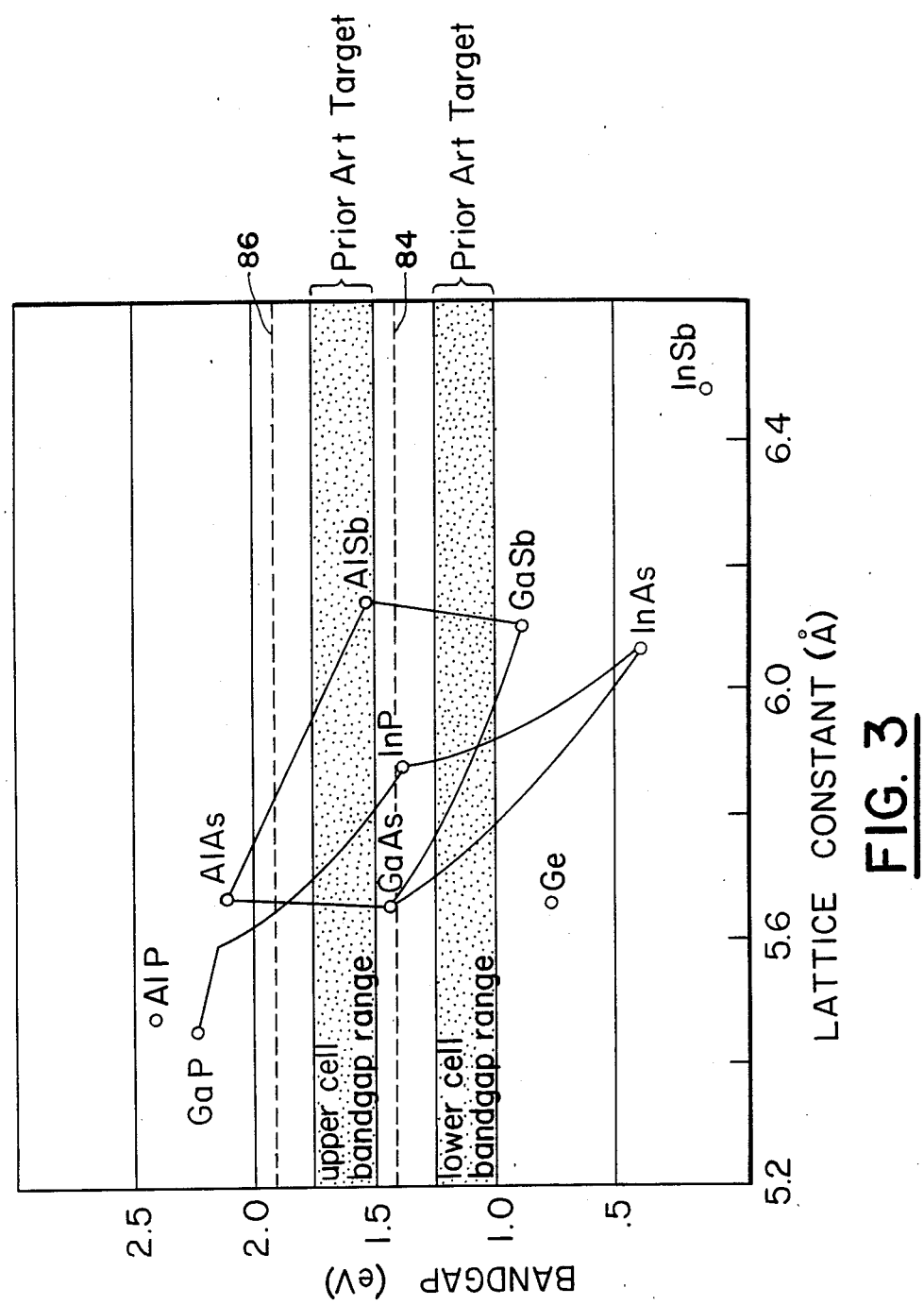
FIG. 3 is a graph showing the prior art upper cell and lower cell band gap target ranges and the band gaps of the top and bottom cells of the present invention.

Neither one of the cells in this $Ga_{0.51}In_{0.49}P/GaAs$ tandem cell is within the desired target band gap range prescribed by the prior art. As shown in FIG. 3, the preferred target band gap ranges before this invention were between 1.0 to 1.25 eV for the bottom cell and between 1.5 to 1.25 eV for the top cell. See the previously-cited Hutchby, et. al., and Fan, et. al., articles, as well as the previously-cited U.S. Pat. Nos. 4,255,221 and 4,332,974. However, as described above, the band gap of bottom cell 30 of the present invention is about 1.4 eV having an n/p homojunction for absorbing and converting solar radiation of 0.85 micron or less to produce about 0.9 to 1.0 V open circuit voltage, and the band gap of the top cell is about 1.9 eV having an n/p homojunction for absorbing and converting solar radiation of wavelengths about 0.65 micron or less to produce about 1.3 to 1.4 V open circuit voltage, as indicated by the lines 84, 86, respectively, in FIG. 3.

While the band gaps of the top and bottom cells 20, 30 of the present invention are not within the desired ranges targeted by the prior art, the solar radiation to electric energy conversion efficiency of the tandem cell 10 of the present invention is very high. Also, while current in this series circuit is limited to the capacity of the lowest current cell (not a problem here because of current matching), the voltages are additive. Experimental cascade solar cells fabricated according to this invention have produced open circuit voltages ($V_{OC}$) of approximately 2.17 V, which is very close to the 2.26 V sum of typical GaAs (0.98 V) and $GaInP_2$ (1.28 V) shallow homojunctions.

So far, these experimental solar cells have also produced a fill factor (FF) of 0.78 and a short circuit current ($J_{SC}$) of 5 mA/cm$^2$ with no antireflective coating (ARC). (The $J_{sc}$ would increase by 45% to 50% with an ARC.) These parameters produce an experimental efficiency of about 13% AM1.

Figure 4:
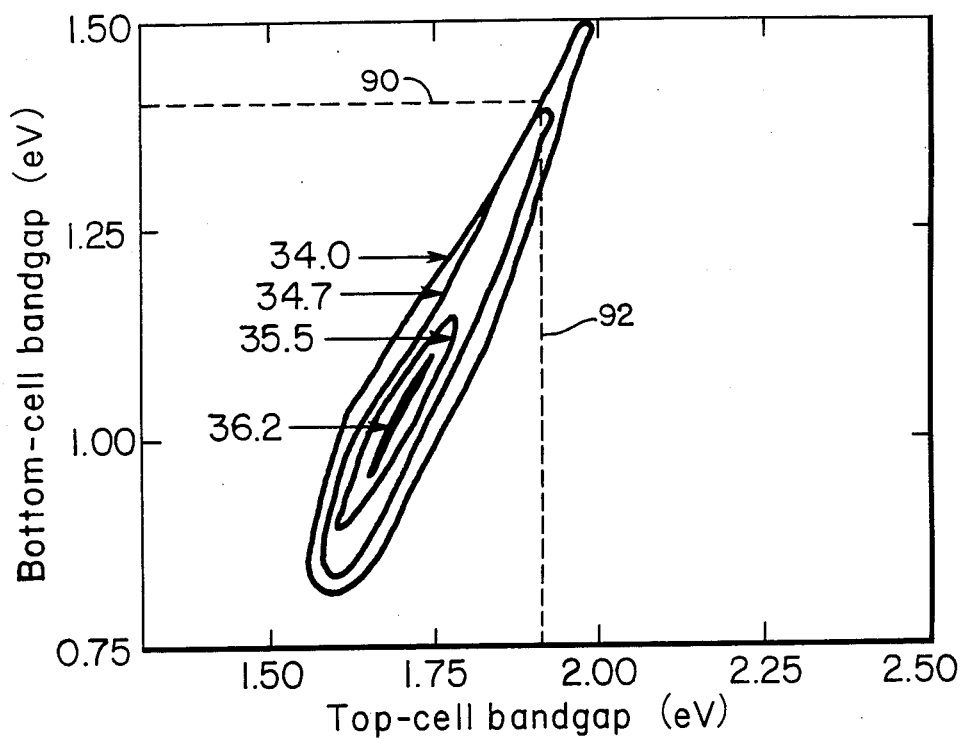
FIG. 4 is a graph showing the theoretical maximum solar radiation to electrical energy conversion efficiency of the tandem solar cell in accordance with the present invention.

While the experimental results still have to be improved, they are already as good, and in some cases better, than the best "target" band gap range multijunction cascade cells produced thus far in the prior art. As shown by lines 90, 92 in FIG. 4, which is derived from the above-cited Fan, et. al., article, while the band gaps of the top and bottom cells 20, 30 of this invention do not provide the maximum theoretical efficiency of 36.2%, they do provide a theoretical efficiency of about 34.0%. The experimental results of this lattice-matched and current-matched $GaInP_2/GaAs$ multijunction solar cell are also surprisingly good particularly in view of previous indications in the prior art that $Ga_{0.48}In_{0.52}P$ was less desirable than such other compositions as $GaAs_{0.77}P_{0.23}$ and $Al_{0.27}Ga_{0.80}As$. See, for example, C. R. Lewis, "Advanced High Efficiency Concentrator Cells—Final Report", SERI/STR-211-24 Solar Energy Research Institute (1984).

Further, there is more promise of substantially increasing the fill factor (FF) and $J_{SC}$ of this lattice-matched and current matched cascade solar cell 20 of this invention than there is for the prior art mismatched lattice structures. For example, it is likely that a different p-type dopant, such as magnesium rather than zinc, and a more pure source of indium will provide significantly better $J_{SC}$ results, probably in the range of 10 to 15 mA/cm$^2$ without ARC, with a $V_{OC}$ of about 2.4 V and a FF of about 0.80. Such results would provide an actual 29% AM1 efficiency.

Additional advantages of the lattice-matched and current matched $GaInP_2/GaAs$ multijunction 20 of this invention are that it has a a simple, relatively easily fabricated structure with only six layers, and that no grading is required between the substrate and the bottom cells. It is also significant that this invention shows that these lattice-matched and current-matched $GaInP_2/GaAs$ structures can be doped effectively.

The foregoing description is considered as illustrative only of the principles of the invention. Further, since numerous modifications and changes will readily occur to those skilled in the art, it is not desired to limit the invention to the exact construction and processes shown and described above. Accordingly, all suitable modifications and equivalents may be resorted to falling within the scope of the invention as defined by the claims that follow.

The embodiments of the invention in which an exclusive property or privilege is claimed are defined as follows:

1. A high-efficiency multijunction photovoltaic solar cell, comprising:
    a top semiconductor cell fabricated of $GaInP_2$ with a light-sensitive n/p homojunction therein for absorbing higher energy photons;
    a bottom semiconductor cell fabricated of GaAs with a light-sensitive n/p homojunction therein for absorbing lower energy photons;
    a low-resistance attachment between said top cell and said bottom cell wherein said $GaInP_2$ is lattice matched to said GaAs; and
    electrical contact means attached to opposite sides of said solar cell to conduct current away from and into said solar cell.

2. The multijunction photovoltaic solar cell of claim 1, wherein said $GaInP_2$ is of the composition $Ga_xIn_{1-x}P$, with $0.505 \leq X \leq 0.515$.

3. The multijunction photovoltaic solar cell of claim 2, wherein said GaAs has a band gap of about 1.4 eV and said $Ga_xIn_{1-x}P$ has a band gap of about 1.9 eV.

4. The multijunction photovoltaic solar cell of claim 3, wherein said bottom cell comprises a p+GaAs substrate with a p-GaAs absorber layer deposited on said substrate, and an n+-GaAs emitter layer deposited on said p-GaAs absorber layer.

5. The multijunction photovoltaic solar cell of claim 4, wherein said top cell comprises a p+-$Ga_xIn_{1-x}P$ interface layer deposited on said n+-GaAs emitter, a p-$Ga_xIn_{1-x}P$ absorber layer deposited on said p+-$Ga_xIn_{1-x}P$ interface layer, and an n+-$Ga_xIn_{1-x}P$ emitter layer deposited on said p+-$Ga_xIn_{1-x}P$ absorber layer.

6. The multijunction photovoltaic solar cell of claim 4, wherein said top cell and said bottom cell are $GaInP_2$ and GaAs compositional structures grown together with a p+/n+ tunnel heterojunction.

7. The multijunction photovoltaic solar cell of claim 6, wherein said p-GaAs absorber layer is about 2.9 to 3.1 microns thick, said n+-GaAs emitter layer is about 0.1 to 0.3 micron thick, said p+-$Ga_xIn_{1-x}P$ absorber layer is about 2.9 to 3.1 microns thick, and said n+-$Ga_xIn_{1-x}P$ emitter layer is about 0.05 to 0.15 micron thick.

8. The multijunction photovoltaic cell of claim 3, which, when exposed to solar radiation, has an open circuit voltage ($V_{OC}$) equal to at least 2.17 V, a short circuit current ($J_{SC}$) of at least 5 mA/cm² without anti-reflective coating (ARC), a fill factor (FF) of at least 0.78, and an efficiency of at least 13% AM1.

9. The method of converting solar radiation to electrical energy, comprising the steps of:
directing the solar radiation into a first cell comprising $Ga_xIn_{1-x}P$, where $X=0.51\pm0.005$, with a band gap of about 1.9 eV, and having an n/p homojunction therein for absorbing and converting solar radiation of a wavelength of about 0.65 micron or less to electrical energy to produce about 1.3 to 1.4 V of open-circuit voltage;
directing the unabsorbed solar radiation into a second cell comprising GaAs that is integrally grown and lattice connected with said $Ga_xIn_{1-x}P$ and having an n/p homojunction therein for absorbing and converting the remaining solar radiation of wavelength of about 0.85 micron or less to electrical energy to produce about 0.9 to 1.0 V of open-circuit voltage, which GaAs second cell is lattice-matched with said $Ga_xIn_{1-x}P$ first cell at a low resistance heterojunction; and
connecting said first and second cells in series to an electrical load.

10. The method of converting solar radiation to electrical energy, comprising the steps of:
directing solar radiation into a $Ga_xIn_{1-x}P$/GaAs multijunction photovoltaic semiconductor device in which the $Ga_xIn_{1-x}P$ top cell is lattice matched at a p+/n+ heterojunction interface with the GaAs bottom cell and in which there is an n/p homojunction in the $Ga_xIn_{1-x}P$ top cell and another n/p homojunction in the GaAs bottom cell;
absorbing higher energy solar radiation of 0.65 micron or less wavelengths in said top cell and converting it to electrical energy in said top cell while allowing lower energy solar radiation to pass through said top cell into said bottom cell;
absorbing lower energy radiation of 0.85 micron or less wavelength and converting it in said bottom cell to electrical energy; and
connecting said device to an electric load.

11. The method of claim 10, including the step of converting the solar radiation to electrical energy of at least $V_{OC}=2.17$ V, $J_{SC}=5.0$ mA/cm², and FF=0.78 with an efficiency of at least 13% AM1.

12. The method of claim 10, including the steps of fabricating said device by creating a low-energy absorber layer in said bottom cell by depositing a layer of p-GaAs on a p+-GaAs substrate, creating a shallow homojunction in said bottom cell by depositing a layer of n+-GaAs on said p-GaAs layer, creating a lattice-matched tunnel heterojunction by depositing a layer of p+-$Ga_xIn_{1-x}P$ on said n+-GaAs layer, where $0.505 \leq X \leq 0.515$, creating a high-energy absorber layer in said top cell by depositing p-$Ga_xIn_{1-x}P$ on said p+-$Ga_xIn_{1-x}P$, and creating a shallow homojunction in said top cell by depositing n-$Ga_xIn_{1-x}P$ on said p-$Ga_xIn_{1-x}P$.

13. The method of claim 12, including the steps of depositing said p-GaAs layer about 2.9 to 3.1 microns thick, depositing said n+-GaAs layer about 0.1 to 0.3 microns thick, depositing said p+-$Ga_xIn_{1-x}P$ layer about 0.1 to 0.3 microns thick, and depositing said n+-$Ga_xIn_{1-x}P$ layer about 0.1 micron thick.

* * * * *